United States Patent [19]
Sinta et al.

[11] Patent Number: 5,900,346
[45] Date of Patent: May 4, 1999

[54] COMPOSITIONS COMPRISING PHOTOACTIVATOR, ACID, GENERATOR AND CHAIN EXTENDER

[75] Inventors: Roger F. Sinta, Woburn, Mass.; Juan C. Scaiano, Gloucester, Canada; Gary S. Calabrese, North Andover, Mass.

[73] Assignee: Shipley Company, L.L.C., Marlborough, Mass.

[21] Appl. No.: 08/808,063

[22] Filed: Feb. 28, 1997

Related U.S. Application Data

[63] Continuation of application No. 08/417,920, Apr. 6, 1995, abandoned.

[51] Int. Cl.$^6$ .................................................. G03F 7/038
[52] U.S. Cl. .................. 430/270.1; 430/914; 430/915; 430/921; 430/926; 522/15; 522/17; 522/25; 522/27; 522/14; 522/23
[58] Field of Search .................. 430/281.1, 270.1, 430/914, 915, 921, 926; 522/15, 17, 25, 27, 14, 23

[56] References Cited

U.S. PATENT DOCUMENTS

| | | | |
|---|---|---|---|
| 3,046,127 | 7/1962 | Barney et al. | 430/281 |
| 3,099,558 | 7/1963 | Levinos | 430/281 |
| 3,515,552 | 6/1970 | Smith | 430/281 |
| 3,966,573 | 6/1976 | Bean | 522/23 X |
| 4,131,529 | 12/1978 | Osterloh et al. | 522/14 X |
| 4,343,885 | 8/1982 | Reardon, Jr. | 430/177 |
| 4,977,198 | 12/1990 | Eckberg | 522/14 X |
| 5,030,548 | 7/1991 | Fujikura et al. | 430/281 |
| 5,164,278 | 11/1992 | Brunsvold et al. | 430/176 |
| 5,212,046 | 5/1993 | Lamola et al. | 522/14 X |
| 5,376,504 | 12/1994 | Graziano et al. | 430/270.1 |
| 5,447,797 | 9/1995 | Stapp et al. | 430/281.1 |

FOREIGN PATENT DOCUMENTS

| | | |
|---|---|---|
| 0 434 098 A2 | 6/1991 | European Pat. Off. . |
| 2280277 | 1/1995 | United Kingdom ............ 430/270 |

OTHER PUBLICATIONS

Abstract—121:121739y (No date Given).
Abstract—121:121740s (No date Given).
Abstract—121:121741t (No date Given).
Abstract—121:121742u (No date Given).
Abstract—121:95742x (No date Given).
Abstract—121:121746y (No date Given).
Bohland et al., *Journal of Photopolymer Science and Technology*, "Some Resists Based On Chemically–Amplified Crosslinking of Phenolic Polymers", vol. 3, No. 3, pp. 355–373, (1990).
Calabrese et al., *Polymers for Microelectronics*, "Electron Transfer Mechanism for Photocatalyst Generation in Some Chemically–Amplified Resists", pp. 435–444, (1990).
Fouassier et al., *Macromolecules*, "Photoinitiation Processes of Radical Polymerization in the Presence of a Three–Component System Based on Ketone–Amine–Bromo Compound", vol. 27, No. 12, pp. 3349–3356, (1994).
Frechet et al., *Polymers in Microlithography*, "Nonswelling Negative Resists Incorporating Chemical Amplifcation", pp. 74–85, (1989).
Ram et al., *Indian Journal of Chemistry*, "A Naphthalene–sensitization Study", vol. 16B, pp. 815–818, (1978).
Chem Abstract: 123:241682.
Frechet et al, Chapter 5, "Non swelling Negative, Resists Incorporating Chemical Application", Edited by Theodore Davidson, *Polymers in Electronics*, 1984, American Chemical Society, pp. 76–85.

*Primary Examiner*—Cynthia Hamilton
*Attorney, Agent, or Firm*—Robert L. Goldberg

[57] ABSTRACT

The present invention relates to novel compositions that contain an activator system that comprises a photoactivator, acid generator and chain extender. Methods and articles of manufacture that comprise such compositions are also provided. In a preferred aspect, the compositions are photoimageable.

23 Claims, No Drawings

COMPOSITIONS COMPRISING PHOTOACTIVATOR, ACID, GENERATOR AND CHAIN EXTENDER

This application is a continuation of application Ser. No. 08/417,920 filed on Apr. 6, 1995 now abandoned.

BACKGROUND OF THE INVENTION

1. Field of the Invention

The present invention relates to novel compositions that contain an activator system that comprises a photoactivator, acid generator and chain extender. Methods and articles of manufacture that comprise such compositions are also provided. In a preferred aspect, the compositions are photoimageable.

2. Background

Curable coatings have been employed for wide range of applications including, e.g., as sealers; components of composition wood products; abrasion resistant coatings such as may be used on vinyl flooring or other construction materials; on textiles; coatings on metals such as beverage can finishes, coatings on electronic parts, and the like; coatings on paper products including curable ink coatings; etc. Curing of the coatings can be accomplished by a number of methods, depending on components of the particular coating composition. Treatment of a coating thermally or with activating radiation such as ultraviolet radiation are common known curing techniques.

Photoimageable coatings are one type of curable coatings and are used for transfer of images to a substrate. In use, the composition is applied as a coating layer on a substrate and the applied layer is selectively exposed through a photomask to a source of activating radiation such as ultraviolet light. The photomask has areas that are opaque to activating radiation and other areas that are transparent to activating radiation. The pattern in the photomask of opaque and transparent areas define a desired image to be transferred to a substrate.

Photoimageable coatings can form negative or positive images. In the case of a negative-acting composition, exposed portions of the coating layer become less developer soluble as a result of a radiation-induced reaction thereby providing differential solubility between exposed and unexposed coating layer portions. In the case of a positive-acting composition, exposed portions of the composition coating layer become more developer soluble as a result of a photo-induced chemical reaction to also provide differential solubility between exposed and unexposed coating layer portions. These differences in solubility allow for the selective removal upon development of unexposed portions of the coating layer in the case of a negative-acting composition, or selective removal of exposed portions in the case of a positive-acting composition, and thus the transfer of an image to the substrate surface. Portions of the substrate surface bared upon development then may be altered as desired such as by etching. The historical background, types and processing of radiation sensitive compositions, including photoresists, is described for example by Deforest, *Photoresist Materials and Processes,* McGraw Hill Book Company, New York (1975); and Moreau, *Semiconductor Lithography, Principles and Materials,* Plenum Press, New York (1988).

A number of materials have been employed as the photoactivatable component in such radiation sensitive compositions. In particular, materials that generate free radicals upon exposure to activating radiation have been employed. The photogenerated free radicals react with one or more other materials of the composition, e.g. to crosslink other composition materials such as an unsaturated monomer or oligomer crosslinker and an acrylate resin. One significant disadvantage of such composition is that the free radical generator is generally oxygen sensitive. As a consequence, special precautions are required to protect the composition from the ambient atmosphere prior to use, adding to manufacturing time and costs.

Another widely used photoactivatable component generates an acid upon exposure to activating radiation. Cationic photoinitiators are commonly used acid generators. The acid produced by the acid generator can induce or promote chemical reactions in a composition coating layer that provides developer solubility differentials between exposed and unexposed regions. For example, the radiation-generated acid can render exposed areas of a composition coating developer soluble by inducing cleavage of certain components of the composition. See, for example, U.S. Patent Nos. 4,968,581; 4,883,740; 4,810,613; and 4,491,628, which describe photogenerated acidic cleavage of certain "blocking" groups pendant from a resin binder, or cleavage of certain blocking groups that comprise a resin binder of positive-acting compositions. In other systems, the radiation-generated acid can render exposed areas of a composition coating effectively developer insoluble by crosslinking of certain composition components. For example, one such negative acting composition highly useful as a photoresist contains 1) a photoactivatable acid generator, 2) a resin binder such as a phenolic resin, and 3) a crosslinker component such as an amine-based material, particularly an a melamine, urea-based material, or benzoguanamine. See, for example, European Patent Applications 0164248 and 0232972. Exposure of a coating layer of the composition to activating radiation results in generation of acid, which in turn catalytically promotes a reaction between the crosslinker and resin binder components to render exposed areas effectively developer insoluble.

While such cationic-based compositions can be highly useful, at least for certain applications they can present notable limitations. Specifically, known cationic photoinitiators generally can be activated by only certain radiation wavelengths. Consequently, to activate a composition at a wavelength to which photoinitiator is by itself not sensitive, either the composition is simply not used for that application, or an additional "sensitizer" material is added to the composition to enable activation of the photoactive component. Use of such a sensitizer is often undesired as it adds an additional component to the composition and can complicate production and use of the radiation sensitive composition.

It thus would be desirable to have a new activation system that would be suitable for use in coating compositions, including photoresists and other photoimageable compositions. It would be particularly desirable to have new photoimageable compositions, including new positive-acting and negative-acting photoresist compositions, that could be activated at a wide range of exposure wavelengths without use of an additional sensitizer material.

SUMMARY OF THE INVENTION

In one aspect, the present invention provides novel coating compositions that comprise a resin binder and a novel activation system, wherein the activation system contains 1) a photoactivator, 2) an acid generator, and 3) a chain extender.

It has been surprisingly found that, in combination, the components of the activation system can dramatically increase the efficiency of acid generation. The activation system also enables photogeneration of acid at exposure wavelengths the acid generator by itself is not typically sensitive (i.e. wavelengths which do not result in generation of acid).

The photoactivator of a photoactivation system of the invention will generate a free radical or radical ion upon exposure to activating energy (heat or light) and may be e.g. an azo compound, sulfur containing compound, triazine, metallic salt or complex, polynuclear compound or an organic carbonyl compound. Benzophenones, sulfonyoxy ketones (such as those sold under the tradename of Irgacure), thioxanthones, various ketones (e.g., bis-(4,4'-dimethylamino)-benzophenone known as Michler's ketone), and polycyclicaromatichydrocarbons such as anthracenes, naphthalenes, etc., are particularly suitable.

The acid generator should generate an acidic species upon activation. Preferred acid generators include halogenated non-ionic compounds, onium salts and sulfonate esters. The halogenated, non-ionic acid generators are particularly preferred, especially organohalide compounds, such as vicinal halides, particularly dihalides such as vicinal dibromides, vicinal dichlorides and vicinal diiodides, e.g. tris[2,3-dibromopropyl]isocyanurate and tris[2,3-dibromopropyl] phosphate.

Preferred chain extenders include dihydroaromatics and heteroatom-containing compounds, particularly materials containing one or more alcohol, amine, ether or sulfide groups. For reasons discussed more fully below, preferably the chain extender will be a good hydrogen donor (containing a labile hydrogen) and can form a radical intermediate that is an effective reducing agent. Particularly preferred chain extenders contain one or more hydrogens that have a bond energy of about 96 kcal/mole or less, even more preferably about 92 kcal/mole or less such as about 85–92 kcal/mole. Further preferred are those chain extenders where the oxidation of the radical intermediates of the chain extenders have reduction potentials of lower than about –0.6 volts, including reduction potentials of less than about –0.8 volts.

Coating compositions of the invention generally include a resin binder component. Suitable resins binders can be a variety of materials that impart film-forming properties to the composition such as those resins typically used as binders in other coating compositions, particularly coatings cured thermally or with photoradiation.

The invention also provides positive-acting and negative acting photoimageable compositions. These composition typically will include a resin binder component. Novolaks, poly(vinylphenols), and non-phenolic resins such as acrylic resins and epoxy resins are generally preferred resins for photoresists and other photoimageable coating compositions of the invention.

Compositions of the invention may be used in a variety of applications including, e.g., coatings on flooring or other construction materials, beverage or food containers (e.g. cans, bottles), textiles, paper products, and the like. Compositions of the invention also will be useful for holography and stereolithography applications.

The invention further provides methods for forming relief images of the photoimageable compositions of the invention, including methods for forming highly resolved photoresist images (e.g., a patterned line having essentially vertical side walls) of micron and sub-micron dimensions.

The invention also provides articles of manufacture comprising substrates having coated thereon a composition of the invention. In the case of photoimageable compositions, the substrate may be e.g. a microelectronic wafer, flat panel display substrate or printed circuit board having coated thereon the photoimageable composition or relief image thereof.

Other aspects of the invention are disclosed below.

DETAILED DESCRIPTION OF THE INVENTION

The present invention provides a novel activation system that comprises 1) a photoactivator, 2) an acid generator, and 3) a chain extender.

While in no event wishing to be bound by theory, it is believed the photoactivation system of the invention can operate via a cyclic mechanism upon exposure to activating energy to regenerate acidic species and provide substantial amplification of the effect of system components. More particularly, and as evidenced by the experimental results set forth in the examples which follow, it is believed that preferred photoactivation systems of the invention may operate upon exposure to activating energy as generally depicted in the following Scheme.

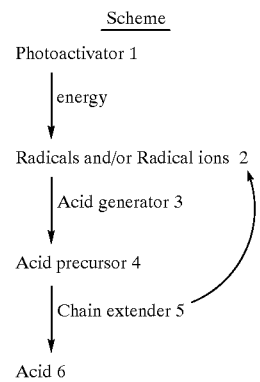

Thus, as generally shown in the above Scheme, the activation system in admixture is treated with activating energy such as visible, infrared or ultraviolet light, or thermal energy. The photoactivator 1 harvests that energy and generates free radicals and/or radical ions 2 which in turn react with the acid generator 3. The photoactivator 1 may be a single compound or a combination of two or more different compounds.

Typically the activation system of the invention will contain three separate components, i.e. the photoactivator, acid generator and chain extender will be separate composition components as discussed above. In certain cases, however, where the acid generator is capable itself is reactive at those radiation wavelength(s) used to activate the composition, a two component activation system can be used that consists of the acid generator and the chain extender, although the photoactivator also could be present in admixture with those components. For example, such a two component activation system potentially could be used if a composition coating layer is exposed to deep U.V. radiation and the acid generator of the composition is sensitive to deep U.V. radiation. In that case, direct irradiation of the acid generator by the deep U.V. radiation will produce the acid precursor 4 which then can further participate in the mechanism as shown in the Scheme above.

The reaction of 2 and 3 produces radical species (acid precursor) 4 of the acid generator 3. The radical acid precursor 4 then reacts with the chain extender 5 to provide the acid 6 that can induce or promote or otherwise participate in reaction with other composition components that may be present. For example, if the activation system is formulated as a component of a photoresist composition, acid 6 (e.g., HBr if an organohalide is used as acid generator 3) can induce a "deblocking" reaction of a resin binder or other component in the case of a positive-acting resist, or acid 6 can induce a crosslinking reaction of reaction components in the case of a negative-acting resist. In other curable systems, acid 6 can induce or otherwise promote curing or hardening of one or more composition components.

The chain extender 5 after reaction with the acid precursor 4 serves to generate further radicals or radical ions 2. The radical species 2 can then undergo subsequent reaction to form the acid precursor 4 and acid 6. By this cycling back of the chain extender, the efficiency of acid generated by the initially applied activating energy is substantially enhanced. See the results of Example 4 which follow.

Preferred photoactivators include compounds and combinations of different compounds that can generate a free radical upon exposure to activating energy such as visible, infrared or ultraviolet radiation or thermal energy. Examples of suitable photoactivators include the azo compounds, sulfur containing compounds, metallic salts and complexes, triazines, oximes, amines, polynuclear compounds, organic dyes, organic carbonyl compounds, organic peroxides, and mixtures thereof as described e.g. in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoactivators which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445, 2,875,047; 3,097,096; 3,074,974; 3,097,097; and 3,145,104 as well as dyes of the phenazine, oxazine, and quinone classes; benzophenone, 2,4,5-tri-phenylimidazolyl dimers with hydrogen donors, and mixtures thereof as described in U.S. Pat. Nos. 3,427,161; 3,479,185; and 3,549,367 can be also used as photoactivators. Specifically preferred photoactivators include 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoactivators are disclosed in Nippon Kagaku Kaisha No. 1192-199 (1984) and include 2,4,6-tris (trichloromethyl)-1,2,5-triazine with 3,3'-carbonyl bis (7-diethylaminocoumarin), 1-methyl-2-benzylmethylene-1,2-dihydronaphthol (1,2d) thiazole, or 9-phenylacridine; 2-mercaptobenzimidazole with 9-phenylacridine; and 3-phenyl-5-isoxazoline with 9-fluorenone or 1-methyl-2-benzylmethylene-1,2-dihydronaphtho (1,2d) thiazole. Suitable photoactivators also include Erythosin B, Merocyanines (540), porphyrins, phthalocyanines, cyanine borates, and the like. Preferred photoactivators include sulfonoxy ketones such as the commercially available Irgacure compounds (e.g., Irgacure 907, 369, 184), Darcocur 1173 ($C_6H_5C(O)C(CH_3)_2OH$), benzophenones, isopropylthioxanthone, perylene, pyrene and rubrene.

The acid generator should generate an acidic species upon activation, i.e. when an activation system of the invention is exposed to activating energy such as light or heat.

Preferred acid generators of the activation systems of the invention include organic compounds having halogen substituents and capable of generating a halogen acid upon exposure to activating radiation. Such halogenated organic photoacid generators include, for example, 1,1-bis[p-chlorophenyl]-2,2,2-trichloroethane (DDT); 1,1-bis[p-methoxyphenyl]-2,2,2-trichloroethane (methoxychlor®); 1,2,5,6,9,10-hexabromocyclododecane; 1,2-dibromodecane; 1,10-dibromodecane; 1,1-bis[p-chlorophenyl]-2,2-dichloroethane; 4,4'-dichloro-2-(trichloromethyl)benzhydrol or 1,1-bis(chlorophenyl)2-2,2-trichloroethanol (Kelthane®); hexachlorodimethylsulfone; 2-chloro-6-(trichloromethyl)pyridine; O,O-diethyl-O-(3,5,6-trichloro-2-pyridyl)phosphorothioate (Dursban®); 1,2,3,4,5,6-hexachlorocyclohe N(1,1-bis[p-chlorophenyl]-2,2,2-trichloroethylacetamide, tris[2,3-dibromopropyl] isocyanurate; 2,2-bis[p-chlorophenyl]-1,1-dichloroethylene; and their isomers, analogs, homologs and residual compounds. Residual compounds are intended to include closely related impurities or other modifications of the above halogenated organic compounds which result during their synthesis and which may be present in minor amounts in commercial products containing a major amount of the above compounds.

Onium salts also can be employed as an acid generator for purposes of the present invention. Suitable onium salts include halogen complex anions of divalent to heptavalent metals or non-metals, for example, Sb, Sn, Fe, Bi, Al, Ga, In, Ti, Zr, Sc, Cr, Hf, and Cu as well as B, P, and As. Examples of suitable onium salts are diaryldiazonium salts and onium salts of group Va and B, Ia and B and I of the Periodic Table, for example, halonium salts, particularly aromatic iodonium and iodoxonium salts, quaternary ammonium, phosphonium and arsonium salts, aromatic sulfonium salts and sulfoxonium salts or selenonium salts. Suitable onium salts are also identified in U.S. Pat. Nos. 4,442,197; 4,603,101; and 4,624,912.

Another group of suitable acid generators is the family of sulfonate esters including sulfonyloxy ketones. Suitable sulfonate esters have been reported in *J. of Photopolymer Science and Technology*, vol. 4, no. 3, 337–340 (1991), incorporated herein by reference, including benzoin tosylate, t-butylphenyl alpha-(p-toluenesulfonyloxy)-acetate, and t-butyl alpha-(p-toluenesulfonyloxy)-acetate.

Preferred chain extenders include dihydroaromatics and hetero-containing compounds, particularly materials containing one or more alcohol, amine, ether or sulfide groups. For reasons discussed with respect to the above Scheme, the chain extender should be able to form a radical intermediate. Specifically preferred chain extenders include e.g. aliphatic alcohols, particularly primary and secondary alcohols such as methanol, ethanol, isopropyl alcohol, 1-propanol, 1-butanol, sec-butyl alcohol and the like. Preferred chain extenders also include lower thiodialkyls such as diethylsulfide and other compounds of the formula R—S—R' where R and R' are each independently alkyl having 1 to about 12 carbon atoms, more typically 1 to about 8 carbon atoms. Substituted amines are also preferred chain extenders, particularly amines di- or tri-substituted with alkyl groups having 1 to about 10 carbon atoms, carbocyclic aryl groups such as phenyl and alkaryl groups such as benzyl. Triethylamine, diethylamine, N,N-diethylaniline, diisopropylethylamine, trihexylamine and tribenzylamine are exemplary preferred compounds. Heteroalicyclic compounds are also preferred chain extenders, particularly those compounds comprising 1–3 fused or separate rings having 5–8 ring members in each ring and 1–3, more typically 1 or 2, N, O or S atoms per ring. Exemplary preferred heterocyclic chain extenders include piperidines, including N-substituted piperidines such as N-ethylpiperidine, morpholine, including N-substituted derivatives such as N-ethylmorpholine, pyrrolidine, quinuclidine, hexamethylenetetraamine, imidazoles such as 2-methylimidazole, and the like. Other suitable chain extenders include e.g. dihydroaromatics, particularly compounds 1–3 separate or fused rings having 5–8 ring members in each ring such as dihydronaphthalene, 1,3-cyclohexadiene and the like; and unsaturated fatty acids and esters such as oleic acid, linoleic acid, arachidonic acid and the like; suberones; and suberenes. Chain extenders preferably may be non-polymeric materials of relatively low molecular weight, e.g., molecular weights of about 1,000 daltons or less, including molecular weights of about 500, 400 or 300 daltons or less.

In addition to the above-described activation system, compositions of the invention typically comprise one or more resins that serve as a binder component for the composition. A variety of resins may be employed and will vary depending on the targeted use of the composition. For example, phenolics, poly(vinylacetates), polyesters, polyethers, acrylics, polyurethanes and the like may be used as a resin in coating compositions of the invention. Preferably the resin imparts good film-forming properties to the composition so that a substantially uniform (e.g. no striations) coating layer of the composition can be applied to a substrate surface.

Acrylic polymers useful as resins for compositions of the invention may be suitably prepared by the polymerization or copolymerization of acrylic acid, methacrylic acid, and the esters or amides thereof, and mixtures of such monomers. For example, suitable polyacrylates may have a molecular weight (weight average) of about 10,000 or 20,000 or more and be formed by free radical polymerization of acrylic acid, methacrylic acid, esters and amides thereof, mixtures of such monomers, and the like. Suitable methacrylate and acrylate esters include lower alkyl esters where the alkyl groups contains from 1 to about 8 carbon atoms, e.g., methyl methacrylate, butylacrylate and the like. Commercially available acrylic polymers will be suitable, including the materials sold under the tradenames of Acryloid, Sarbox and Scripset (540 and 550 by Monsanto). For photoimageable compositions of the inventions, acrylic resins are preferred as a binder component, particularly those acrylic resins that have been previously employed in photoresist compositions. See, for example, the resins disclosed in U.S. Pat. 4,592,816.

Vinyl polymers other than the acrylic or methacrylic polymers mentioned above also may be used as a resin binder in compositions of the invention. Suitable vinyl resins will include polystyrenes, polymaleimides and poly(vinylalcohols).

Other suitable resin binders of compositions of the invention include phenolic resins, particularly phenol aldehyde condensates known in the art as novolak resins, homo and copolymers of alkenyl phenols and homo and copolymers of N-hydroxyphenyl-maleimides.

Examples of suitable phenols for condensation with an aldehyde, especially formaldehyde, for the formation of novolak, resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred poly(vinylphenol) resins prepared from such vinylphenols have a molecular weight range of from about 2,000 to about 60,000 daltons. Copolymers containing phenol and nonaromatic cyclic alcohol units also may be employed and which may be suitably prepared by partial hydrogenation of a novolak or poly(vinylphenyl) resin. Such copolymers and the use thereof in photoimageable compositions are disclosed in U.S. Pat. No. 5,128,232 to Thackeray et al.

Additional suitable resin binders include resins formed from bishydroxymethylated compounds, and block novolak resins. See U.S. Pat. Nos. 5,130,410 and 5,128,230 where such resins are disclosed.

In the case of photoimageable compositions of the invention, the resin binder suitably has functional groups that impart alkaline aqueous developability to the photoimageable composition. For example, preferred are resin binders that comprise polar functional groups such as hydroxyl or carboxylate. Thus, acrylic resins that have such polar functional groups and phenolics such as poly(vinylphenols) and novolaks are preferred resins for use as a binder component of the photoimageable composition. Exemplary acrylic resins that have polar functional groups are disclosed in the above-mentioned U.S. Pat. 4,592,816. Preferably the resin binder is used in a photoimageable composition in an amount sufficient to render a coating layer of the composition developable with an aqueous alkaline solution. Also, two or more resin binders of similar or different compositions can be blended or combined together to give additive control of lithographic properties. For instance, blends of resins can be used to adjust photospeed and thermal properties and to control dissolution behavior of a resist in a developer.

Compositions of the invention, including negative-acting photoimageable compositions, may suitably contain one or more crosslinkers that will participate in curing or hardening of composition component(s) upon exposure to activating energy. The crosslinker component is typically a separate composition component, but also could be grafted onto the resin binder.

A preferred crosslinker is an amine-based material such as a melamine monomer, oligomer or polymer, and various resins such as melamine-formaldehyde, benzoguanamine-formaldehyde, urea-formaldehyde and glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Specifically suitable amine-based crosslinkers include the melamines manufactured by American Cyanamid Company of Wayne, N.J., such as Cymel® 300, 301, 303, 350, 370, 380, 1116 and 1130; benzoguanamine resins such as Cymel® 1123 and 1125; the glycoluril resins Cymel® 1170, 1171 and 1172; and the urea-based resins Beetle® 60, 65 and 80. A large number of similar amine-based compounds are commercially available from various suppliers.

Of the above amine-based crosslinkers, the melamines are preferred. Particularly preferred are melamine formaldehyde resins, i.e. reaction products of melamine and formaldehyde. These resins are typically ethers such as trialkylol melamine and hexaalkylol melamine. The alkyl group may have from 1 to as many as 8 or more carbon atoms but is preferably methyl. Depending upon the reaction conditions and the concentration of formaldehyde, the methyl ethers may react with each other to form more complex units.

Epoxy containing materials are another preferred group of crosslinkers. Epoxy containing materials are any organic compounds having one or more oxirane rings that are polymerizable by ring opening. Such materials, broadly called epoxides, include monomeric epoxy compounds, and oligomeric and polymeric epoxides that may be aliphatic, cycloaliphatic, aromatic or heterocyclic. Preferred materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Illustrative of suitable substituents include halogens, ester groups, ethers, sulfonate groups, siloxane groups, nitro groups, phosphate groups, etc.

Further epoxy containing materials useful in the practice of this invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Further examples of epoxides of this type are described in U.S. Pat. No. 3,018,262.

There are many commercially available epoxy containing materials which can be used in the compositions of the invention. In particular, epoxides which are readily available include epichlorohydrin, glycidol, glycidylmethacrylate, the glycidyl ether of p-tertiarybutylphenol (e.g., those available under the trade name "Epi-Rez" 5014 from Celanese); diglycidyl ether of Bisphenol A (e.g., those available under the trade designations "Epon 828", "Epon 1004" and "Epon 1010" from Shell Chemical Co.; and "DER-331", "DER-332" and "DER-334" from Dow Chemical Co.), vinylcyclohexene dioxide (e.g., "ERL-4206" from Union Carbide Corp.), 3,4-epoxy-6-methyl-cyclohexyl-methyl-3,4-epoxy-6-methylcyclohexane carboxylate (e.g., "ERL-4201" from Union Carbide Corp.), bis(3,4-epoxy-6-methylcyclohexylmethyl)adipate (e.g., "ERL-4289" from Union Carbide Corp.), bis(2,3-epoxycyclopentyl) ether (e.g., "ERL-0400" from Union Carbide Corp.), aliphatic epoxy modified with polypropylene glycol (e.g., "ERL-4050" and "ERL-4269" from Union Carbide Corp.), dipentene dioxide (e.g., "ERL-4269" from Union Carbide Corp.), flame retardant epoxy resins (e.g., "DER-580," a brominated bisphenol type epoxy resin available from Dow Chemical Co.), 1,4-butanediol diglycidyl ether of phenolformaldehyde novolak (e.g., "DEN-431" and "DEN-438" from Dow Chemical Co.), and resorcinol diglycidyl ether (e.g., "Kopoxite" from Koppers Company, Inc.).

Positive photoimageable compositions of the invention typically contain one or more components that can undergo photoacid induced or promoted cleavage to thereby create solubility differentials between exposed and unexposed regions of the composition. A number of such materials have been described, e.g., in U.S. Pat. Nos. 5,258,257; 4,968,581; 4,883,740; 4,810,613 and 4,491,628 and Canadian Patent Application 2,001,384. Positive acting photoimageable compositions that utilize such acid cleavable materials are known in the art as "chemically-amplified" compositions because a single acid molecule typically induces multiple cleavage reactions, i.e. cleavage reaction is catalytic with respect to acid.

A generally preferred material is a resin that contains pendant cleavable groups. See the above-mentioned patents for such cleavable groups. Alkyl acetate groups, such as t-butyl acetate groups, and oxycarbonyl groups, such as t-butoxy carbonyl groups, are generally preferred pendant cleavable groups. Other preferred materials will contain cleavable groups as integral members of the resin binder, so that photoinduced cleavage results in chain scission.

Compositions of the invention are suitably formulated by admixing desired components, i.e. the activation system, resin binder and/or crosslinker, in a suitable solvent, e.g., a glycol ether such as 2-methoxyethyl ether (diglyme), ethylene glycol monomethyl ether, propylene glycol monomethyl ether; a Cellsolve ester such as methyl Cellsolve acetate; an aromatic hydrocarbon such toluene or xylene; or a ketone such as methylethyl ketone. Typically the order of admixing composition components together is not critical. Solids content of liquid coating compositions of the invention can vary within a relatively wide range, e.g., between about 5 and 70 percent by weight of the total weight of the composition. Typically the solids content will be between about 5 and 50 percent by weight.

Photoimageable compositions of the invention are generally prepared following known procedures for preparation of positive and negative acting photoresists with the exception that the photoactivation system of the invention is substituted for prior photoactive compounds or components used in the formulation of such prior photoresists. Thus, a photoimageable composition of the invention can be prepared as a coating composition by dissolving the components of the composition in a suitable solvent such as a glycol ether, ketone such as methyl ethyl ketone or other solvent such as those mentioned above. Typically the solids content of a photoimageable composition of the invention varies between 5 and 35 percent by weight of the total weight of the composition.

Preferably a photoactivator is present in a composition of the invention in an amount of from about 5 and 30 weight percent of total solids of a coating composition, more preferably from about 10 and 20 weight percent of total solids of a coating composition; an acid generator is present in an amount of from about 2 and 30 weight percent of total solids of a coating composition, more preferably from about 5 and 20 weight percent based on total solids of a coating composition; and the chain extender is present in an amount of from about 1 and 20 weight percent based on total solids of a coating composition, more preferably from about 5 and 15 weight percent based on total solids of a coating composition.

The resin binder component of compositions of the invention will typically constitute between about 30 to 60 or more weight percent of total solids of the composition. In general, a suitable concentration of the crosslinker component (if present) is about 5 to 30 weight percent of total solids, more typically about 10 to 20 weight percent of total solids. As would be understood by those skilled in the art, the term total solids of a composition as used herein refers to all components of a composition other than a solvent carrier.

In addition to the components described above, conventional additives also may be added to the compositions of the invention such as adhesion promoters, materials to enhance chemical or abrasion resistance, materials to development and resolution characteristics in the case of photoimageable compositions, etc. However, as discussed above, in the case of photoimageable compositions, use of a sensitizer material will not be typically required to expand or enhance spectral responsiveness, unlike prior photoacid-based resist compositions.

Coating compositions of the invention can be generally used in accordance with known procedures. For example, to apply a protective coating on a substrate such as a metal or plastic part, textile, paper product, flooring material, and the like, a liquid coating composition of the invention is cast onto to the substrate by known coating techniques such as spraying, roller coating, dipping, etc. It is typically preferred that the substrate surface is cleaned and/or pretreated by known procedures prior to coating. The applied coating layer is dried to remove the solvent carrier and then exposed to activating energy (heat or light) to generate acid and cure the coating layer. After exposure to the activating energy, the coating layer may be subjected to one or more curing bakes, e.g., at temperatures of from 70° C. to 180° C. for between about 20 and 120 minutes, depending on the particular components of a composition. Such curing bakes can harden unreacted composition components and may promote adhesion of the coating to the underlying substrate.

Photoimageable compositions of the invention suitably can be used in accordance with known procedures. The compositions are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image. The substrate suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Substrates used for liquid crystal display and other flat panel display applications are also suitably employed, e.g., glass and plastic substrates, indium tin oxide coated substrates and the like. A liquid coating composition may be applied by any standard means such as spinning, dipping or roller coating. The exposure energy should be sufficient to effectively activate the photoactivation system to produce a patterned image in the composition coating layer. Suitable exposure energies may suitably range from about 10 to 1000 mJ/cm$^2$, although higher exposure energies also may be employed. Exposure of a coating layer can be carried out at atmospheric pressure or reduced pressure by placing the photomask in contact with the composition coating layer and exposing the coating through the mask to desired radiation or alternatively, using off contact procedures as are known in the art.

A wide range of exposure wavelengths may be employed to photoactivate compositions of the invention, including radiation in the infrared range, particularly the near infrared (ca. 800 nm or greater) including about 1060 nm, and in the ultraviolet range, including in the deep U.V. range (ca. 100 to 300 nm), particularly about 193 nm and 248 nm, or longer wavelengths such as the mid UV region (ca. 300 to 360 nm) and near UV region (ca. 360 to 450 nm), particularly I-line (365 nm), H-line (405 nm) and G-line (436 nm) wavelengths, and other wavelengths such as about 488 nm (Ar-ion). Again, the ability of compositions of the invention to be activated at such a wide range of exposure wavelengths is a significant advantage over prior photoacid-based systems which can either not be used outside of a particular exposure wavelength, or require use of an additional sensitizer component, assuming such a sensitizer could be identified and would not deleteriously affect lithographic properties of the composition.

Suitable post-exposure bake temperatures typically range from about 50° C. or greater, more specifically from about 50 to 140° C. For a negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example, chemically etching or plating substrate areas bared of photoresist in accordance with procedures known in the art. Suitable etchants include a plasma gas etch such as an oxygen plasma etch and etching solutions such as a hydrofluoric acid etchant, ferric chloride etching solution (particularly for etching Cu such as a copper clad laminate used as a printed circuit board substrate), a permanganate etching solution, a cupric chloride solution and the like.

In addition to microelectronic and flat panel display wafer fabrication as discussed above, compositions of the invention can be employed by the same or similar lithographic techniques to manufacture a wide variety of other articles such as e.g. information storage devices (e.g., cassette disks), laser diodes, printed circuit boards, etc. Compositions of the invention also will be highly useful for holographic and stereolithography applications.

As discussed above, compositions of the invention also are useful in applications that do not involve patterned imaging. For example, negative-acting compositions can be blanket exposed to activating radiation to provide a photo-cured protective layer. Such cured coatings can be used for a wide variety of applications such as on flooring or other construction materials, cans, bottles, textiles, paper products, and the like. The coatings may be applied onto a variety of materials such as metals including coated metals such as steel or treated steel e.g. phosphatized steel, aluminum, copper, etc. glasses, wood materials, paper materials, plastic materials such as polyesters, polyethylenes, etc.

Compositions of the invention, including photoimageable compositions, may be used to form a dry film laminate, which dry film is then subsequently applied to a substrate. A dry film laminate of the invention can be suitably produced by coating a liquid coating composition as described above onto a suitable support such as a polyester film and then covering the dried coating layer with a thin polymer film, e.g. a polyolefin film. The thin film can be peeled away prior to use and the solid coating layer is applied to a substrate surface by lamination.

All documents mentioned herein are incorporated herein in their entirety.

The following non-limiting examples are illustrative of the invention.

EXAMPLE 1 pH Determination 0.2221 g and 0.2322 g of 1,2-dibromomethane were dissolved in 10 mL of 2-propanol and acetonitrile, respectively. Two 3 mL-aliquot of each solution were placed in quartz cells (7×7 mm$^2$) and deaerated by bubbling oxygen-free nitrogen for 15 minutes. Samples were then irradiated at 254 nm using a photoreactor equipped with two RPR-254 lamps. Samples were rotated with a "merry-go-round" (to ensure that all samples received the same irradiation dose) and irradiated for 15 minutes. After irradiation, identical samples were combined. The pH values of the solutions were determined using a glass combination electrode. The electrode was calibrated using standard buffers of pH=7 and pH=4. The resulting pH values are summarized in the table below.

| Solvent | pH before irradiation | pH after irradiation |
| --- | --- | --- |
| acetonitrile | 7.64 | 6.80 |
| 2-propanol* | 7.08 | 0.25 |

EXAMPLE 2

Quantum Yields of Acid Formed from Acid Generator in the Presence of Photoactivator 0.2256 g of 1,2-dibromoethane were dissolved in 10 mL of methanol. Three 3 mL-aliquots of this solution were placed in quartz cells (7×mm$^2$) and deaerated by bubbling oxygen-free nitrogen for 15 minutes. In addition, 3 mL of a cyclohexane solution of valerophenone (50 mM) and dodecane (2.2 mg/mL) were placed in a quartz cell (7×7mm$^2$) and deaerated by bubbling oxygen-free nitrogen for 15 minutes. All samples were irradiated at 254 nm using a photoreactor equipped with one RPR-254 lamp. Samples were rotated with a "merry-go-round" to ensure that all samples received the same irradiation dose. Solutions of dibromoethane were irradiated for 15 minutes. After irradiation, HBr concentrations were determined by acid-base titrations using 0.0991M NaOH in methanol as titrant and phenolphthalein as indicator. The resulting quantum yield of HBr formation (e.g. $\phi_{HBr}$=10) was determined using valerophenone as a relative actinometer as follows. The valerophenone sample was irradiated for one hour at 254 nm. The extent of photocleavage of valerophenone to yield acetophenone upon irradiation was determined by gas chromatography using dodecane as internal standard. 1 µL aliquots of irradiated and non-irradiated valerophenone solutions were analyzed on a capillary gas chromatograph using a DB-5 bonded-phase column from J & W Scientific. Runs started at 80° C. temperature held for two minutes and then increased to 280° C. at a rate of 30° C./min. Typical retention times were 3.2, 4.7 and 5.9 minutes for acetophenone, dodecane and valerophenone, respectively. In the Table, DBrE refers to 1,2-dibromoethane, DBrD refers to 1,2-dibromodecane and DBrPP refers to tris[2,3-dibromopropyl]phosphate.

| # | Dibromide | Solvent | [diBr], M*$^1$ | $\phi$HBr$^2$ |
| --- | --- | --- | --- | --- |
| 1 | DBrE | Methanol | 0.12 | 10 |
| 2 | DBrE | 1-Propanol | 0.12 | 21 |
| 3 | DBrE | 2-Propanol | 0.12 | 38 |
| 4 | DBrD | Methanol | 0.12 | 10 |
| 5 | DBrD | 2-Propanol | 0.12 | 41 |
| 6 | DBrPP | Methanol | 0.04 | 16 |
| 7 | DBrPP | 1-Propanol | 0.04 | 21 |
| 8 | DBrPP | 2-Propanol | 0.04 | 41 |

$^1$[diBr] designates moles of dibromide formed.
$^2\phi$ designates quantum yield.

EXAMPLE 3

Use of Photoactivator

The extent of photoconversion of 1,2-dibromodecane can be established either by direct titration of the acid (i.e., HBr) produced or by chromatographic analysis of the alkene (i.e., 1-decene) formed. 0.0926 g and 0.1543 of 1,2-dibromodecane and dodecane (20 µL/mL of solution) were dissolved in 5 mL of methanol and 10 mL of 2-propanol, respectively. Two mL-aliquot of each solution were placed in quartz cells (7×7 mm$^2$) and deaerated by bubbling oxygen-free nitrogen for 15 minutes. Samples were then irradiated at 254 nm using a photoreactor equipped with RPR-254 lamps. Samples were rotated with a "merry-go-round" (to ensure that all samples received the same irradiation dose) and irradiated for 10 minutes. After irradiation, HBr concentrations were determined by acid-base titrations using 0.0975 M NaOH in methanol as described above in Example 2. 1-Decene concentrations were determined by gas chromatography using dodecane as internal standard. 1-µL aliquots of irradiated and non-irradiated solutions were analyzed on a capillary gas chromatograph using a DB-5 bonded-phase column from J & W Scientific, Runs were started at 80° C., temperature held for two minutes and then increased to 280° C. at a rate of 30° C./minute.

Solutions were prepared by dissolving all of the following in a total volume of 5 mL methanol and 2-propanol, respectively: (a) 60.0 mg 1,2-dibromodecane, 10.8 mg of benzophenone and 12.6 mg of dodecane; (b) 65.2 mg 1,2-dibromodecane, 11.2 mg benzophenone and 11.2 mg dodecane. Two 2mL-aliquot of each solution were placed in quartz cells (7×7 mm$^2$) and deaerated by bubbling oxygen-free nitrogen for 15 minutes. Samples were then irradiated at 350 nm using a photoreactor equipped with two RPR-350 lamps. Samples were rotated with a "merry-go-round" (to ensure that all samples received the same irradiation dose) and irradiated for 1 hour (methanol) or 40 minutes (2-propanol). A valerophenone solution (prepared as described above) was used as a relative actinometer. Product (i.e. 1-decene) quantification and quantum yields were carried out as described above. Results are summarized in the table below. No 1-decene was formed in the absence of benzophenone.

| # | Solvent | C=C[1] | φC=C[2] |
|---|---|---|---|
| 1 | Methanol | 7.2 mM | 0.68 |
| 2 | 2-Propanol | 9.2 mM | 1.3 |

[1]C=C designates moles of alkene formed.
[2]φC=C quantum yield of alkene formed.

EXAMPLE 4

Use of Chain Extender

Solutions were prepared by dissolving all of the following in a total volume of 5 mL: (a) 32.7 mg of 1,2-dibromodecane, 18.3 mg of benzophenone and 10.0 mg of dodecane in acetonitrile(ACN)/methanol (15:85 v/v); (b) 24.2 mg 1,2-dibromodecane, 22.4 benzophenone and 10.0 mg dodecane in acetonitrile/2-propanol (15:85 v/v); (c) 22.7 mg 1,2-dibromodecane, 20.7 mg benzophenone and 10.0 mg dodecane in acetonitrile/propylsulfide (15:85 v/v); (d) 25.0 mg 1,2-dibromodecane, 21.5 mg benzophenone and 10.5 mg dodecane in acetonitrile/triethylamine (15:85 v/v). Two 2 mL aliquots of each solution were placed in quartz cells 7×7 mm$^2$) and deaerated by bubbling oxygen-free nitrogen for 15 minutes. Samples were then irradiated at 350 nm using a photoreactor equipped with two RPR-350 lamps. Samples were rotated with a "merry-go-round" (to ensure that all samples received the same irradiation dose) and irradiated for 1.5 hours (methanol), 40 minutes (2-propanol), 30 minutes (propylsulfide) or 1 minute (triethylamine). A valerophenone solution (prepared as described above) was used as relative actinometer. Product (i.e. 1-decene) quantification and quantum yields were carried out as described above. Results are summarized in the table below. No 1-decene is formed (a) in the absence of benzophenone or (b) in the absence of the chain extender.

| # | Solvent | C=C[1] | φC=C[2] |
|---|---|---|---|
| 1 | ACN/Methanol | 1.06 mM | 0.11 |
| 2 | ACN/2-Propanol | 0.96 mM | 0.14 |
| 3 | ACN/(Propyl)$_2$S | 0.60 mM | 0.13 |
| 4 | ACN/(C$_2$H$_5$)$_3$N | 4.1 mM | 23 |

[1]C=C designates moles of alkene formed.
[2]φC=C quantum yield of alkene formed.

EXAMPLE 5

Imaging of Coating Composition

A copolymer of polymethacrylate containing 12% hydroxyethylmethacrylate (HEMA) and 13% methacrylic acid (MAA) and an epoxide (EPON 828) (75:25) was formulated with 22% (based on polymer weight) of tris(2,3-dibromopropyl)phosphate, 18.8% (based on polymer weight) hexamethoxymethylmelamine, 30% (based on polymer weight) benzophenone and 11% (based on polymer weight) triethylamine. The coating composition was prepared at 25% total solids in propyleneglycol monomethyl-ether acetate. 4" silicon wafers were vapor primed in hexamethyldisilazane (HMDS) for four minutes and the formulation was spin coated onto the wafers at 2000 rpm for 30 seconds to give 1.5 μm thick film.

The coated wafers were soft baked at 90° C. for 60 seconds on a vacuum hot plate and cooled for 3 seconds on a cooling plate. The wafers were exposed on the HTG exposure tool at 365 nm (using an in-line filter), through an Optoline® mask and post exposure balked at 115° C. for 60 seconds. A strong latent image was observed. Immersion development in 0.14N aqueous tetramethylammonium hydroxide (CD14) for 60 seconds gave a negative tone image. Exposure energy was 1607 mJ/cm$^2$.

EXAMPLE 6

A coating composition was prepared that was identical to the coating composition of Example 5, except the coating composition of this Example did not contain benzophenone or any other photoactivator. The coating composition was processed as described in Example 5. No latent or developed image of the coating composition layer was obtained.

EXAMPLE 7

A coating composition was prepared that was identical to the coating composition of Example 5, except the coating composition of this Example did not contain triethylamine or any other chain extender. The coating composition was processed as described in Example 5. No latent or developed image of the coating composition layer was obtained.

The foregoing description of the invention is merely illustrative thereof, and it is understood that variations and modifications can be effected without departing from the spirit or scope of the invention as set forth in the following claims.

What is claimed is:

1. A negative-acting photoresist composition which consists of a resin binder, a crosslinker and a photoactivation system effective for generating a latent image by exposure of a coating of the composition to activating radiation, the photoactivation system containing 1) a photoactivator that is an organic carbonyl containing compound, 2) an acid generator, 3) a chain extender and 4) a crosslinker.

2. The photoresist composition of claim 1 wherein the composition is photoimageable at an exposure wavelength at which the acid generator would not be effectively activated in the absence of the photoactivator.

3. The photoresist composition of claim 1 wherein the composition is not effectively photoimageable at a desired wavelength in the absence of the chain extender.

4. The photoresist composition of claim 3 wherein the photoactivator is benzophenone.

5. The photoimageable composition of claim 1 wherein the composition is chemically amplified with respect to photogenerated acid.

6. The photoresist composition of claim 1 wherein the acid generator is a halogen containing compound.

7. The photoresist composition of claim 1 wherein the acid generator is an organohalide.

8. The photoresist composition of claim 1 wherein the photoactivator is present in an amount of from about 5 to 30 weight percent, the acid generator is present in an amount of from about 2 to 30 weight percent, and the chain extender is present in an amount of from about 1 to 20 weight percent, all said amounts based on total solids of the composition.

9. The photoresist of claim 1 wherein the crosslinking agent is a melamine resin.

10. The photoresist of claim 9 wherein the crosslinking agent is hexamethoxymethyl melamine.

11. A negative-acting photoresist composition which consists of a resin binder, a crosslinker and a photoactivation system effective for generating a latent image by exposure of a coating of the composition to activating radiation, the photoactivation system containing 1) a photoactivator, 2) an acid generator, 3) a chain extender containing one or more amine groups and 4) a crosslinker.

12. The photoresist composition of claim 11 wherein the acid generator is a halogen containing compound.

13. The photoresist composition of claim 12 wherein the acid generator is an organohalide.

14. The photoresist of claim 11 wherein the crosslinking agent is a melamine resin.

15. The photoresist of claim 14 wherein the crosslinking agent is hexamethoxymethyl melamine.

16. The photoresist composition of claim 11 wherein the photoactivator is present in an amount of from about 5 to 30 weight percent, the acid generator is present in an amount of from about 2 to 30 weight percent, and the chain extender is present in an amount of from about 1 to 20 weight percent, all said amounts based on total solids of the composition.

17. A negative-acting photoresist composition which consists of a resin binder, a crosslinker and a photoactivation system effective for generating a latent image by exposure of a coating of the composition to activating radiation, the photoactivation system containing 1) a photoactivator that is an organic carbonyl containing compound, 2) an acid generator, 3) a chain extender containing one or more amine groups and 4) a crosslinker.

18. The photoresist composition of claim 17 wherein the photoactivator is benzophenone.

19. The photoresist composition of claim 17 wherein the acid generator is a halogen containing compound.

20. The photoresist composition of claim 19 wherein the acid generator is an organohalide.

21. The photoresist of claim 17 wherein the crosslinking agent is a melamine resin.

22. The photoresist of claim 21 wherein the crosslinking agent is hexamethoxymethyl melamine.

23. The photoresist composition of claim 17 wherein the photoactivator is present in an amount of from about 5 to 30 weight percent, the acid generator is present in an amount of from about 2 to 30 weight percent, and the chain extender is present in an amount of from about 1 to 20 weight percent, all said amounts based on total solids of the composition.

* * * * *